United States Patent [19]

Lake

[11] Patent Number: 4,799,314
[45] Date of Patent: Jan. 24, 1989

[54] METHOD OF MOUNTING A PRINTED CIRCUIT BOARD

[75] Inventor: Ralph Lake, Yorba Linda, Calif.

[73] Assignee: Unisys Corporation, Blue Bell, Pa.

[21] Appl. No.: 69,549

[22] Filed: Jul. 2, 1987

[51] Int. Cl.⁴ .......................... H05K 5/00; H05K 3/36
[52] U.S. Cl. ........................................ 29/846; 29/830; 361/399; 439/74; 439/92
[58] Field of Search .................... 29/830, 846; 439/74, 439/92; 361/399

[56] References Cited

U.S. PATENT DOCUMENTS 2,756,485  7/1956  Abramson et al. ................... 29/380
2,848,568  8/1958  Berkeley et al. ....................... 439/74
3,895,267  7/1975  Gordon et al. ..................... 439/92 X Primary Examiner—P. W. Echols
Assistant Examiner—Taylor J. Ross
Attorney, Agent, or Firm—Albert B. Cooper; Laurence J. Marhoefer

[57] ABSTRACT

A mounting method for printed circuit boards provides improved electromagnetic interference reduction while minimizing the required number of mounting screws. A conductive base plate formed with supporting members is configured to mate with a grounding circuit on the board. A central mounting screw places the board in compression to provide electrical continuity between the grounding circuit and the supporting members of the conductive plate.

3 Claims, 1 Drawing Sheet

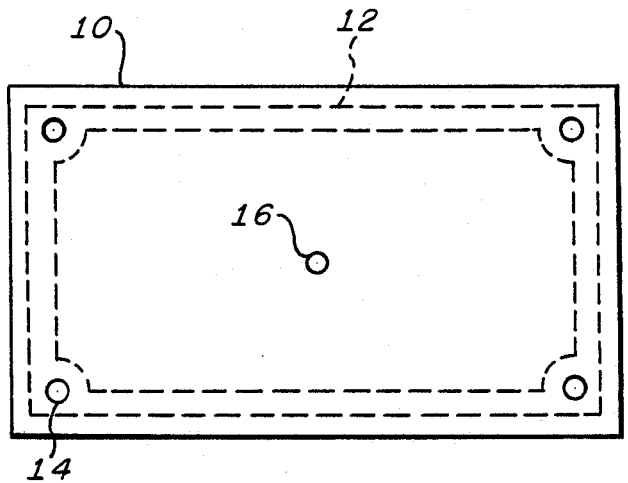
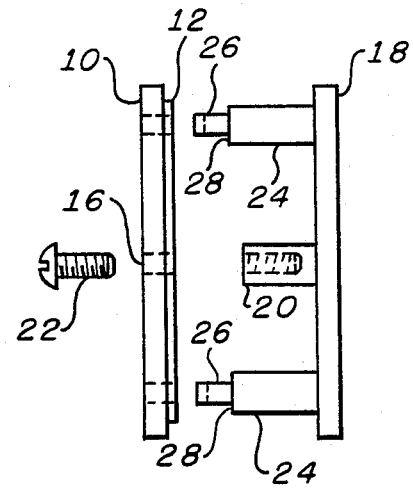
FIG.1.  FIG.2.
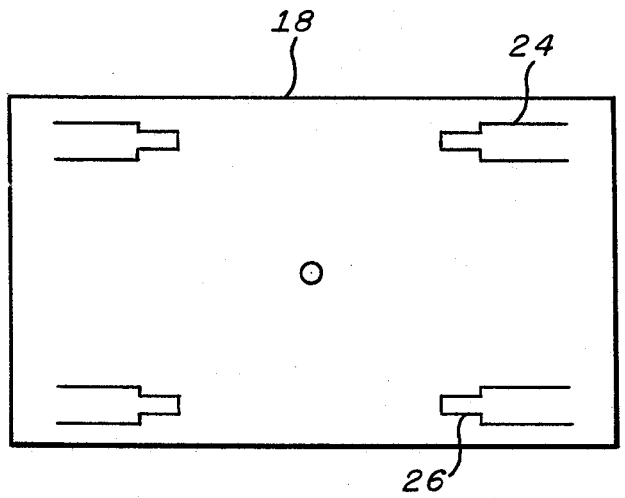
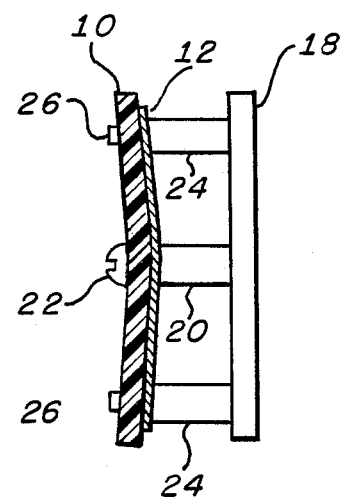
FIG.3.  FIG.4.

METHOD OF MOUNTING A PRINTED CIRCUIT BOARD

BACKGROUND OF THE INVENTION

1. Field of the Invention

The invention relates generally to printed circuit boards and more particularly to a method of mounting printed circuit boards for reduction of electromagnetic interference.

2. Description of the Prior Art

Conventional mountings for printed circuit boards involve multiple mounting points, generally a minimum of five points symmetrically disposed at the corners and center of the board. In order to reduce radiated and conducted electromagnetic interference, and to provide a low impedance path for suppression components, the board must be mounted in close proximity to and in intimate electrical contact with a ground plane. Electrical contact to the ground plane is made by the use of conductive mounting screws. However, the traditional method has the disadvantage of requiring a plurality of such mounting screws and the associated cost of labor and materials for installation. The present invention provides a method and apparatus for mounting printed circuit boards which requires only a single mounting screw.

SUMMARY OF THE INVENTION

The present invention provides a method for mounting a printed circuit board to reduce electromagnetic interference wherein the board is provided with an electrically conductive grounding path printed thereon. The board is further provided with a hole centrally disposed and a plurality of peripheral holes, the peripheral holes extending through regions of the grounding path. A conductive base path, to furnish a circuit ground, has mounted thereon a threaded stud arranged for alignment with the central hole of the printed circuit board. The plate is further provided with a plurality of supporting members integrally formed from the plate, and located along the periphery of the plate so as to engage the peripheral holes of the circuit board. The supporting members are provided with a shoulder for supporting the board and a flange which extends through the peripheral holes when assembled with the board. The supporting members and the stud have longitudinal dimensions so constructed and arranged that when assembled with a screw through the stud, the board will be compressed against the shoulders of the mounting plate. The plate and board are then assembled by engaging each of the peripheral holes with a flange and inserting a screw through the centrally disposed hole engaging the stud. When the screw is tightened, the board is compressed against the supporting members so that electrical conductivity is provided between the grounding path on the board and the conductive base plate.

BRIEF DESCRIPTION OF THE DRAWINGS

FIG. 1 shows a printed circuit board in plan view.

FIG. 2 shows an exploded view of the printed circuit board and a base plate in end view.

FIG. 3 is a pictorial representation of a conductive base plate in plan view.

FIG. 4 is a drawing showing the printed circuit board assembly in end view.

DESCRIPTION OF THE PREFERRED EMBODIMENT

FIG. 1 shows a planar printed circuit board 10, having an electrically conductive path 12 for grounding the circuits etched on the board (not shown). Along the periphery of the board are a plurality of holes 14 extending through the board 10 and the conductive path 12. The board is further provided with a centrally disposed hole 16 which may or may not engage the conductive grounding path, as desired.

Referring now to FIG. 2, the circuit board 10 is arranged for assembly with a conductive base plate 18. The base plate 18 has mounted thereon a stud 20 which is aligned to engage with the hole 16 of the printed circuit board 10. A screw 22 has cooperating threads for engaging stud 20 when inserted through the hole 16 after assembly of the base plate and circuit board. The base plate 18 is further provided with a plurality of supporting members 24. Each member 24 has a shoulder 26 for supporting the board 10 at the peripheral holes 14 and a flange 28 which has a length sufficient to extend throught the board 10 and the holes 14. The longitudinal dimension of the member 24 and the stud 20 are so arranged that the board will be compressed against the shoulders of the members when screw 22 is secured in stud 20.

Referring now to FIG. 3, the structure of mounting plate 18 is shown in greater detail. It may be seen that each member is formed by lancing or punching plate 18 to form an integral supporting member having the configuration shown thereon. Each member 24 is then formed to extend orthogonally from the plate 18.

As shown in FIG. 4, when board 10 is assembled to plate 18 with screw 22 the board is formed in a concave shape and forced to exert a substantial pressure against the members 24, thereby engaging the conductive path 12 with the conductive members 24. It will be clear to one skilled in the art that if the holes 14 are provided with conductive vias electrically connected to a further printed circuit on the top surface of board 10, the conductive path may be further extended as desired. To provide further mechanical rigidity, the flange 28 may be peened over the board 10 as shown at element 26 of FIG. 4. A permanent electrical connection may be made by soldering each peened flange or shoulder 24 to the corresponding electrically conductive path of board 10.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A method for mounting a printed circuit board comprising:
   providing a printed circuit board having an electrically conductive grounding path printed thereon, a hole centrally disposed within said board, and a plurality of peripheral holes engaging said grounding path and extending through said board;
   providing a conductive base plate with a centrally disposed threaded stud aligned with said hole of said board, said stud having a first predetermined longitudinal dimension and said plate configured to face said electrically conductive grounding path, providing a plurality of integrally formed supporting members on said mounting plate, said members formed orthogonal to said plate, and said members disposed at the periphery of said plate so as to cooperate with said peripheral holes of said board, providing ones of said supporting members with a flange for accepting ones of said peripheral holes and a shoulder for supporting said board, said shoulder longitudinally disposed on said member at a second predetermined dimension greater than said first predetermined dimension; and assembling said plate and said board by inserting a flange of at least one of said supporting members through a cooperating peripheral hole of said board, inserting a screw through said centrally disposed hole of said board and engaging said stud, and tightening said screw so that said board is compressively engaged against said supporting members, thereby electrically engaging said conductive grounding path and said conductive base plate.

2. A method for mounting a printed circuit board comprising:

providing a printed circuit board having an electrically conductive grounding path printed thereon, a hole centrally disposed within said board, and a plurality of peripheral holes engaging said grounding path and extending through said board;

providing a conductive base plate with a centrally disposed threaded stud aligned with said hole of said board, said stud having a first predetermined longitudinal dimension and said plate configured to face said electrically conductive grounding path;

providing a plurality of integrally formed supporting members on said mounting plate, said members formed orthogonal to said plate, and said members disposed at the periphery of said plate so as to cooperte with said peripheral holes of said board;

providing ones of said supporting members with a flange for accepting ones of said peripheral holes and a shoulder for supporting said board, said shoulder longitudinally disposed on said member at a second predetermined dimension greater than said first predetermined dimension;

assembling said plate and said board by inserting a flange of at least one of said supporting members through a cooperating peripheral hole of said board, inserting a screw through said centrally disposed hole of said board and engaging said stud, and tightening said screw so that said board is compressively engaged against said supporting members, thereby electrically engaging said conductive grounding path and said conductive base plate; and peening ones of said flange of said supporting members so as to further secure said board to said shoulder, whereby said electrically conductive grounding path of said board is further electrically connected through said supporting members to said conductive base plate.

3. The method as set forth in claim 2, further comprising:

soldering ones of said peened flange to said conductive path.

* * * * *